(12) United States Patent
Jung

(10) Patent No.: US 6,586,970 B1
(45) Date of Patent: Jul. 1, 2003

(54) ADDRESS DECODER WITH PSEUDO AND OR PSEUDO NAND GATE

(75) Inventor: Chang Ho Jung, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 4 days.

(21) Appl. No.: 09/953,842

(22) Filed: Sep. 17, 2001

(51) Int. Cl.[7] .............................................. H03K 19/094
(52) U.S. Cl. ........................ 326/105; 326/106; 326/108
(58) Field of Search ................................ 326/105, 106, 326/108, 112, 119, 121; 365/230.06

(56) References Cited

U.S. PATENT DOCUMENTS

| | | | | |
|---|---|---|---|---|
| 5,351,217 A | * | 9/1994 | Jeon ....................... | 365/230.06 |
| 5,490,119 A | * | 2/1996 | Sakurai et al. ......... | 365/230.08 |
| 5,777,943 A | * | 7/1998 | Kim et al. ............. | 365/230.06 |
| 5,982,702 A | * | 11/1999 | Bosshart ................ | 365/230.06 |

* cited by examiner

Primary Examiner—Michael Tokar
Assistant Examiner—Anh Q. Tran
(74) Attorney, Agent, or Firm—Suiter Wess PC LLO

(57) ABSTRACT

The present invention describes a multi-stage decoder and method of decoding utilizing a pseudo NAND or pseudo AND gate in one of the stages. This invention presents a decoder comprising a first stage circuit having two or more first inputs which generates one or more first outputs; and a second stage circuit having at least one second input and at least one second output, wherein the one or more first outputs are the same as the at least one second input, wherein at least one of the group consisting of the first stage circuit and the second stage circuit includes either a pseudo AND gate or a pseudo NAND gate. This invention presents a method of decoding, comprising the steps of generating a signal responsive to two or more address bits and enabling a decoder by the generated signal.

20 Claims, 4 Drawing Sheets

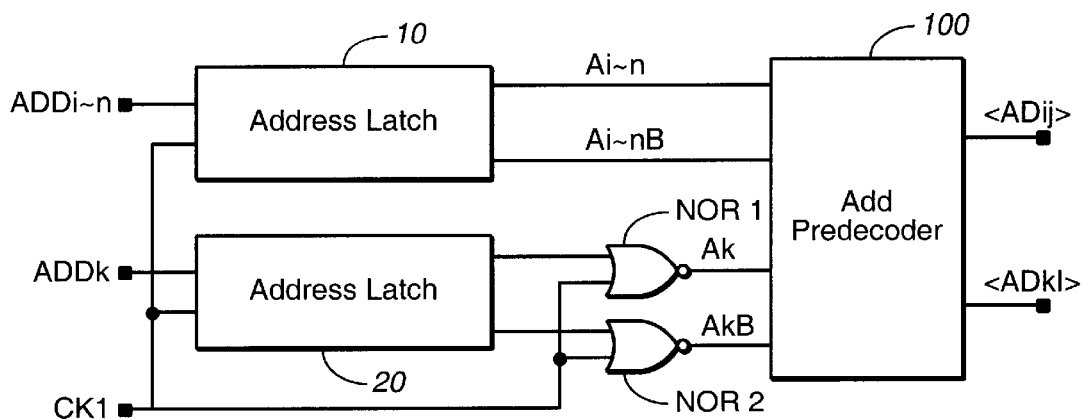
FIG._1
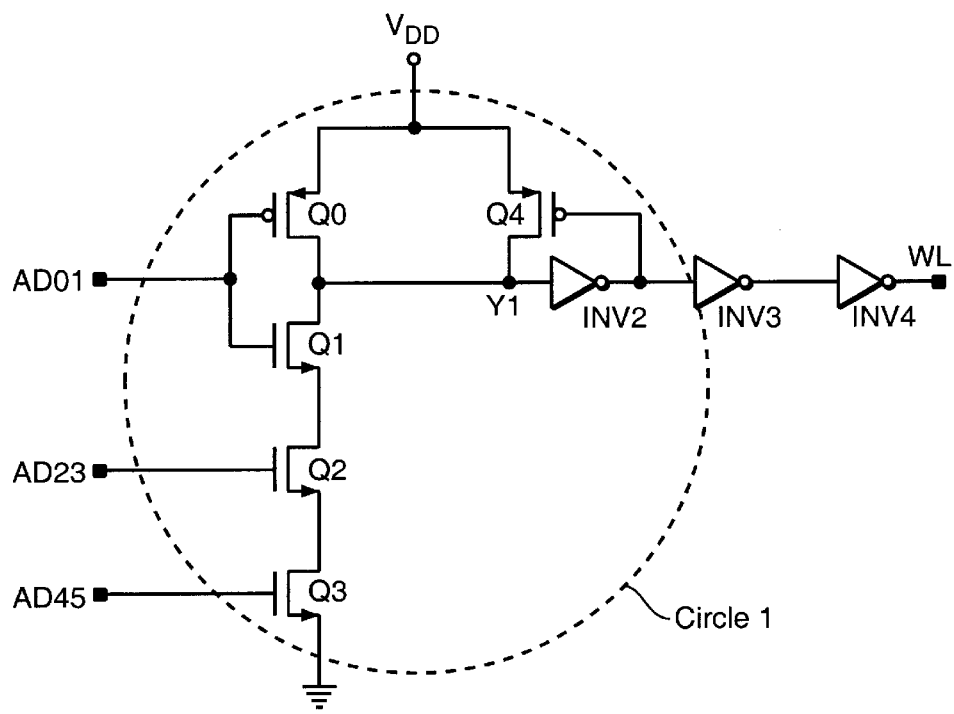
FIG._2

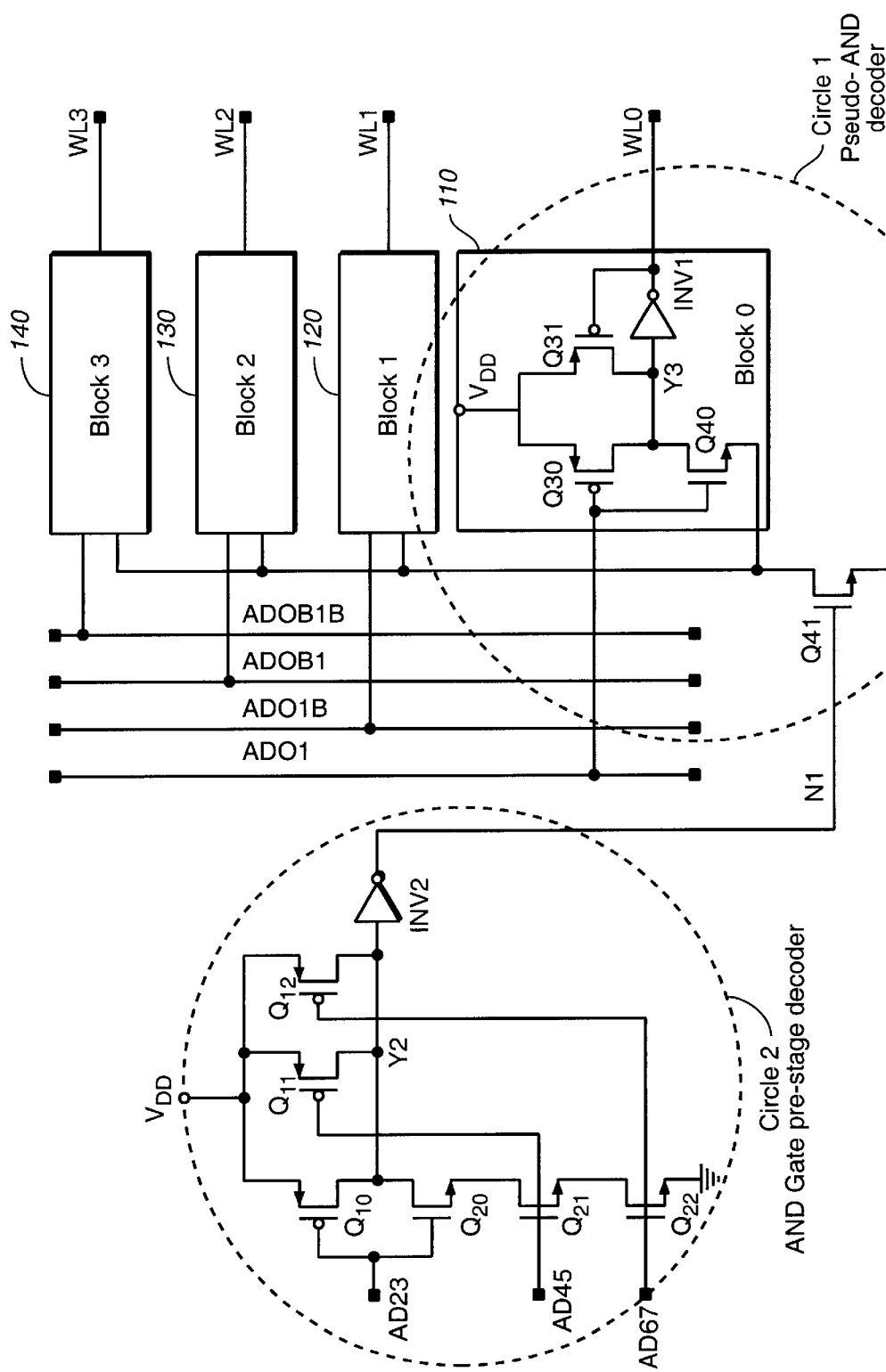
FIG._3

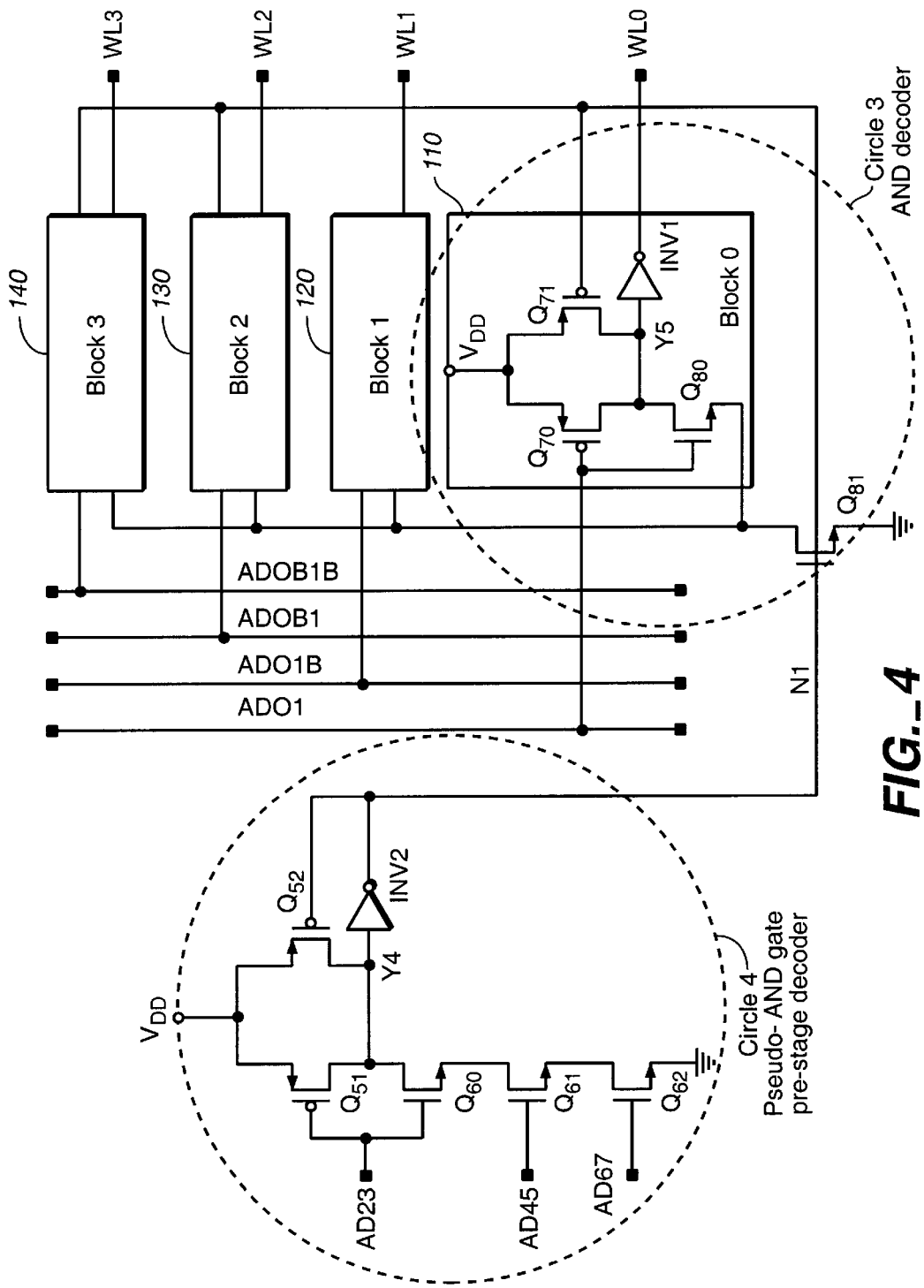
FIG._4

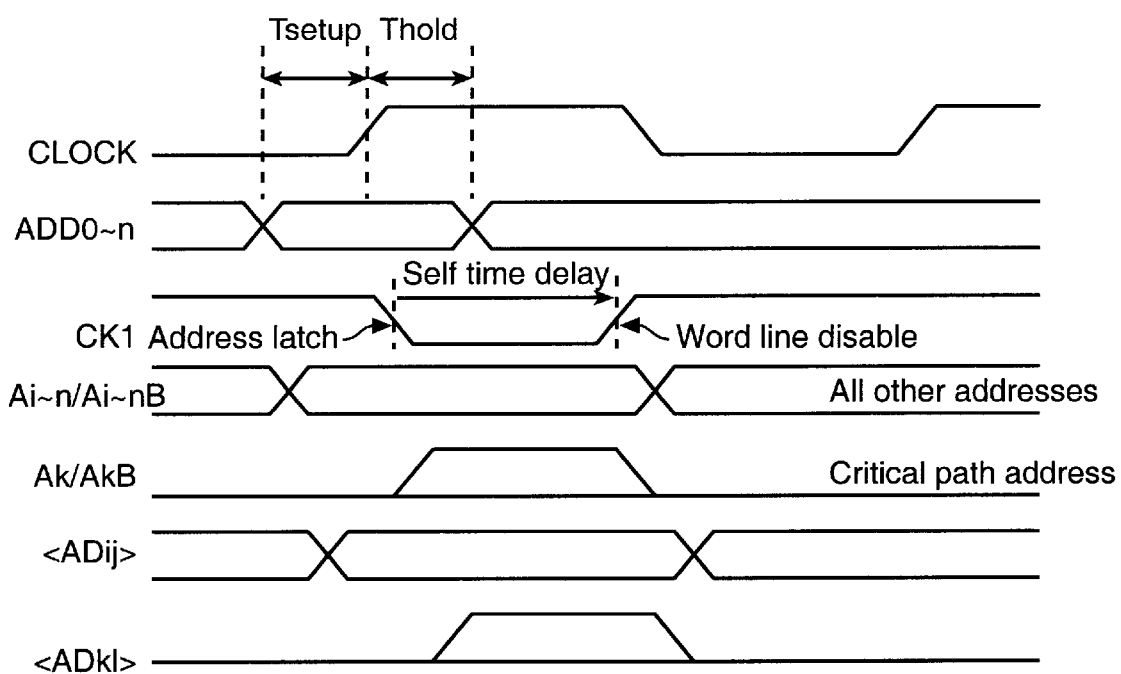
FIG._5

ADDRESS DECODER WITH PSEUDO AND OR PSEUDO NAND GATE

FIELD OF THE INVENTION

The present invention generally relates to the field of decoders, and particularly to a decoder with a single critical path for a very high speed synchronous memory.

BACKGROUND OF THE INVENTION

A series of AND gates or a series of NOR gates, which are the complement of AND gates, are used for decoding of logical input signals, to address memory matrices. As an example, for each group of AND circuits, hereinafter called AND blocks or conventional decoders, there is provided a plurality of logical input signals, depending on the operation to be performed, and there is one output decoded line for each conventional decoder. Associated with each conventional decoder is also a clock pulse input to provide the necessary switching logic for the proper operation of the devices. The conventional decoder blocks are commonly used in the MOSFET large scale integration technology to provide addressing or accessing signals for storage memory arrays. The number of address lines for the memory has been limited by the number of decoded output lines available from the conventional decoders for a particular chip size wherein the spacing between the decoded output lines is referred to as "pitch". Consequently, using MOSFET technology ground rules suitable for maximum density memory fabrication put a restriction on the minimum pitch and minimum array dimensions achievable with these ground rules using conventional decoders, the limitation being the minimum pitch dimension of the conventional decoders.

When a word line decodes an address, the decoder is usually drawn as a NAND gate. This NAND gate takes a large layout area in the tight row decoder pitch. To drive these arrayed NAND gates, the pre-decoder output driver is big.

If a dynamic NAND gate is used for a decoder, a pre-charger signal is required to disable the word line and this pre-charger driver size will be big. A big driver size makes a big load on the previous stage and it makes lower performance also. And it may cause skew or race problem of address and control signal.

SUMMARY OF THE INVENTION

An object of the present invention is to provide word line decoder and driver circuits for high density semiconductor memories.

Accordingly, the present invention is directed to a decoder scheme in which one row address (usually the lowest significant bit address) is controlled to be a critical path by address set up control and word line disable timing. Pre-decoded address with the above address bit will control the PMOS transistors of the pseudo AND or pseudo NAND gate.

This invention is smaller and faster than a full AND or full NAND implementation and simpler than a dynamic AND or dynamic NAND implementation as it relates to the control signal derivation.

This invention presents a decoder comprising a first stage circuit having two or more first inputs which generates one or more first outputs; and a second stage circuit having at least one second input and at least one second output, wherein the one or more first outputs supplies a signal to the at least one second input, wherein at least one of the group consisting of the first stage circuit and the second stage circuit includes either a pseudo AND gate or a pseudo NAND gate.

This invention presents a method of decoding, comprising the steps of generating a signal responsive to two or more address bits and enabling a decoder by the generated signal.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 shows a schematic of an address buffer and pre-decoder.

FIG. 2 illustrates a schematic of a pseudo AND gate used in the invention.

FIG. 3 illustrates a first embodiment in which an AND gate is used in the first decoder stage and a pseudo-AND gate is used in the second decoder stage.

FIG. 4 illustrates a second embodiment in which a pseudo-AND gate is used in the first decoder stage and an AND gate is used in the second decoder stage.

FIG. 5 illustrates a timing diagram for the first and second embodiments.

DETAILED DESCRIPTION OF THE INVENTION

In memories there is an address comprised of binary signals which specify a particular location in that memory. The address is generally divided into a row address and a column address. The row address selects a word line which is enabled. The column address selects one or more bit lines which are then used for providing data. In the case of static random access memories (SRAMs), each memory cell is coupled to a pair of bit lines so that each pair is decoded together. As memories become larger, the number of transistors required to perform a row or column decode becomes larger. For example, in the case of a 64K×1 memory, there are 16 address signals required to specify a particular location. This could be arranged as 8 column address signals and 8 row address signals. To use standard logic-gate type decoding would require 8 N channel transistors and 8 P channel transistors at each bit line location that is to be decoded.

To avoid this, predecoding techniques have been developed to avoid having such a large number of transistors at each bit line or word line. One of the objects then of any predecoding technique is to reduce the number of transistors at the decoder area. In CMOS, two binary signals can be decoded using four transistors, two N channel transistors and two P channel transistors.

Reference will now be made in detail to the presently preferred embodiments of the invention, examples of which are illustrated in the accompanying drawings.

FIG. 1 shows a schematic of an address buffer and pre-decoder. All addresses are latched by CK1 and make Ai~n and Ai~nB ("Ai~n bar", the inversion of Ai~n). ADDk makes Ak and AkB (the inversion of Ak), which are outputs of NOR gates that are controlled by CK1. CK1 is generated by the external clock rising and the self-time delay that controls the word line disable timing as shown in FIG. 5. Ak and AkB are low initially and enabled later than any other address. They also return low earlier because all input addresses must have address buffer delay. Therefore, Ak and AkB can be the critical path of all row paths. The output of the pre-decoder, <ADkl>, can be the critical path also because the pre-decoder consists of AND gates such that all other pre-decoder outputs (ADij) transition sooner.

In FIG. 2, <ADkl> is represented by <AD01> and is fed into the Q0 and Q1 transistors of the pseudo AND gate (Circle 1) to decode the row address. <AD23> and <AD45>, the other pre-decoder outputs, will drive each NMOS transistor only. If all pre-decoder output drivers are the same size, Q2 and Q3 transistor size can be relatively big to be driven with the same fan out of the predecoder, and equivalent transistor of serial Q1, Q2 and Q3 will be increased to drive the decoder faster.

The pseudo AND architecture can be used in combination with AND architecture for tight pitch. In FIG. 3, <AD01> is the same address as <ADkl> in FIG. 1. In FIG. 3, <AD01> is fed into the Q30 and Q40 transistors of pseudo AND gate (Circle 1), and the previous stage AND buffer drives the Q41 transistor only. Therefore, the Q41 transistor size can be maximized to increase the discharging current of Q40.

If AD23 is controlled the same as ADkl (the critical path address), the previous stage of the AND gate can be made of a pseudo AND gate as shown in FIG. 4. Block0 of FIG. 4 is a full AND gate instead of pseudo AND gate. It is understood that the circuitry of BLOCK0 is duplicated for other BLOCKs 1–3.

The pseudo AND gate will take less layout area than a full AND gate. Other serial NMOS transistor sizes can be maximized to increase the discharging current of the pseudo AND gate. The driver size of the pre-decoders can also be minimized because they only have NMOS loads in the decoder. There is not any skew or racing problem because of the single critical path of the ADDk address.

Although AND and pseudo AND gates have been discussed, the invention may be implemented by NAND and pseudo NAND gates or a combination thereof. The pseudo AND gate of FIG. 2 may be converted to a pseudo NAND configuration by adding another inverter after inverter INV2 or by eliminating one of inverters INV3 or INV4.

FIG. 5 shows the timing diagram of the schematics. The address bits are in a stable state at least equal to the set up time $T_{setup}$. The address bits are in the same stable state at least equal to the hold time $T_{hold}$. Both the set up time $T_{setup}$ and the hold time $T_{hold}$ are measured with respect the clock signal CLOCK which drives the timed circuitry prior to the latch. A timing signal CK1 derived from the clock signal is used to clock the latches and provide a signal for <ADkl>. Timing signal CK1 may be generated by a monostable multivibrator circuit or other pulse generating circuitry. The pulse length of CK1 needs to be sufficiently long so as to avoid prematurely activating the decoders. The timing signal CK1 is normally high. On its falling edge, latching of the address bits ADDi~n and ADDk occurs. Signal CK1 also serves as the input along with certain latched address bits for generating Ak and AkB. The address bits Ai~n, Ai~nB, Ak, and AkB pass through address predecoders to generate address bits <ADij> and <ADkl>.

Alternatively, Ak and AkB can be output of NOR gate with CK1 or output of AND gate with CK1B (inverted CK1).

In operation, in FIG. 2, a logic low input on address bit AD01 which applies ground to the gates of PMOS transistor Q0 and NMOS transistor Q1 initially. The N-channel device Q1 is unbiased, and therefore has no channel enhanced within itself. It is an open circuit, and therefore leaves the output line disconnected from transistors Q2 and Q3. At the same time, the P-channel device Q1 is on, so it has a channel enhanced within itself. Because transistor Q0 conducts, the voltage from the source VDD, save for a small voltage drop across the transistor, appears at node Y1, resulting in a high signal. Inverters INV3 and INV4 essentially act as delays to the output of INV2 and generate a high signal for word line signal WL.

When a logic high is applied to address bit AD01, the N-channel device Q1 is turned on and the P-channel device Q0 is turned off. To determine the logic value of node Y1, it is necessary to consider the states of the N-channel devices Q2 and Q3. If either address bits AD23 or AD45 are turned off, then NMOS transistors Q2 and Q3 are turned off and node Y1 cannot be a logic low. If it was a logic low before the transition events, then it will be pulled high because inverter INV2 will output a high signal which turns on transistor Q4 which causes a high voltage to appear at node Y1. The high voltage at node Y1, in turn, causes the inverter INV2 to output a low signal which turns off P-channel device Q4. The passing of the signal output by inverter INV2 through the inverters INV3 and INV4 results in a high signal for word line signal WL.

In the case where a logic high is applied to transistors, Q0, Q1, Q2, and Q3, then PMOS transistor Q0 will be turned off and NMOS transistors Q1, Q2, and Q3 will be turned on. Because all NMOS transistors in the tree to ground will be turned on, the node Y1 will also be pulled to ground. The output of inverter INV2 will become high turning on PMOS transistor Q4. However, the NMOS transistors Q1, Q2, and Q3 will successfully keep the node Y1 voltage as a logic low through proper selection of transistors Q1, Q2, Q3, and Q4. There will, however, be some voltage division between the turned on devices Q1, Q2, Q3, and Q4.

In FIG. 3, Circle 2 functions as a normal AND gate. When any of address bits AD23, AD45, or AD67 are a logic low, the NMOS transistor tree made up of transistors Q20, Q21, and Q22 will be turned off and at least one of the PMOS transistors Q10, Q11, and Q12 will be turned on resulting in node N1 being a logic high.

When node N1 is a logic high, NMOS transistor Q41 is turned on presenting a voltage close to ground to the source of NMOS transistor Q40 of Block 0. If address bit AD01 is a logic low, NMOS transistor Q40 turns on, PMOS transistor Q30 turns off, and node Y3 turns to logic low. There is some pull up effect from PMOS transistor since inverter INV1 outputs a logic high to the PMOS transistor Q31, turning it on. Decoder word line WL0 is a logic high.

When node N1 is a logic high and address bit AD01 is a logic high, NMOS transistor Q40 turns off, PMOS transistor turns on, and node Y3 turns to a logic high. Decoder word line WL0, the inversion of node Y3, turns low.

When all address bits of the AND gate pre-decoder of Circle 2 are logic highs, node Y2 goes low. Node N1 becomes a logic high. This turns off all the NMOS transistors from ground in the decoder represented by BLOCK0, BLOCK1, BLOCK2, and BLOCK3. In the pseudo AND gate decoder of Circle 1, node Y3 then goes and stays at a logic high since even if PMOS transistor Q30 is turned off, the combination of PMOS transistor Q31 with Q31's source tied to the positive voltage supply, the drain of Q31 tied to the input of inverter INV1, and the gate of PMOS transistor Q31 tied to the output of inverter INV1 will drive node Y3 to go high. This causes decoder word line WL0 to go to a logic low. In similar fashion, where node N1 is logic low, all the other decoder outputs WL1, WL2, and WL3 go to logic lows.

As the drain of NMOS transistor Q41 is tied in similar fashion to corresponding NMOS transistors in BLOCK1, BLOCK2, BLOCK3 and so on, it acts as an enable signal for the decoder.

In FIG. 4, Circle 4's pseudo AND gate functions as a predecoder. Only when all the gate inputs of NMOS transistors Q20, Q21, and Q22, representing address bits AD23, AD45, and AD67, are high, will the pseudo AND gate of Circle 4 produce a high output as signal N1. When signal N1 is a logic high, if address bit AD01 is a logic high, WL0 will be a logic high, and if address bit AD01 is a logic low, WL0 will be a logic low.

This predecoder permits a reduction in the number of transistors used in the decoder which is preferably a MOS device AND gate.

The decoding circuits described above may be used in various memory devices such as read-only memories and read/write memories.

It is believed that the Address Decoder with the Pseudo NAND or Pseudo AND Gate of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A two stage decoder circuit, comprising:
   a first stage circuit suitable for receiving a first portion of address bits from an address bus to generate a control signal, the first stage circuit including a pseudo AND gate;
   a second stage circuit suitable for receiving a second portion of address bits from the address bus, the second stage circuit including a plurality of subcircuits, each of the plurality of subcircuits being suitable for receiving an address bit from the second portion of address bits from the address bus, each of the plurality of subcircuits generating a word line signal and having a discharging current; and
   a discharging transistor controlled by the control signal of the first stage circuit through a single critical path, the discharging transistor providing a common discharge path for the discharging currents of the plurality of subcircuits of the second stage circuit,
   wherein the pseudo AND gate comprises
      first and second PMOS transistors arranged in parallel, drains of the first and second PMOS transistors being connected to a node and sources of the first and second PMOS transistors being connected to a positive power supply;
      first and second NMOS transistors, a source of the first NMOS transistor being connected to a drain of the second NMOS transistor, a drain of the first NMOS transistor being connected to the node, and a source of the second NMOS transistor being connected to either a negative power supply or ground; and
      an inverter having an output terminal connected to a gate of one of the first and second PMOS transistors and an input terminal connected to the node.

2. A two stage decoder circuit, comprising:
   a first stage circuit suitable for receiving a first portion of address bits from an address bus to generate a control signal;
   a second stage circuit suitable for receiving a second portion of address bits from the address bus, the second stage circuit including a plurality of subcircuits, each of the plurality of subcircuits being suitable for receiving an address bit from the second portion of address bits from the address bus, each of the plurality of subcircuits generating a word line signal and having a discharging current, each of the plurality of subcircuits of the second stage circuit including a pseudo AND gate; and
   a discharging transistor controlled by the control signal of the first stage circuit through a single critical path, the discharging transistor providing a common discharge path for the discharging currents of the plurality of subcircuits of the second stage circuit,
   wherein the pseudo AND gate comprises
      first and second PMOS transistors arranged in parallel, drains of the first and second PMOS transistors being connected to a node and sources of the first and second PMOS transistors being connected to a positive power supply;
      first and second NMOS transistors, a source of the first NMOS transistor being connected to a drain of the second NMOS transistor, a drain of the first NMOS transistor being connected to the node, and a source of the second NMOS transistor being connected to either a negative power supply or ground; and
      an inverter having an output terminal connected to a gate of one of the first and second PMOS transistors and an input terminal connected to the node.

3. The two stage decoder circuit of claim 1, wherein the discharging transistor is connected to circuit ground.

4. The two stage decoder circuit of claim 1, wherein the discharging transistor is connected to a negative power supply.

5. The two stage decoder circuit of claim 2, wherein the discharging transistor is connected to a negative power supply.

6. The two stage decoder circuit of claim 2, wherein the discharging transistor is connected to circuit ground.

7. A method for decoding for a two stage decoder, comprising the steps of:
   receiving a first portion of address bits from an address bus by a first stage of the two stage decoder;
   receiving a second portion of the address bits from the address bus by a second stage decoder;
   generating a control signal by the first stage of the two stage decoder for switchably controlling a switch through a single critical path; and
   controlling a plurality of subcircuits of the second stage of the two stage decoder through the switch to enable the second stage of the two stage decoder by discharging current from the portion of subcircuits of the second stage of the two stage decoder through a common discharge path through the switch,
   wherein the first stage of the two stage decoder includes a pseudo AND gate,
   wherein the pseudo AND gate comprises first and second PMOS transistors arranged in parallel, drains of the first and second PMOS transistors being connected to a node and sources of the first and second PMOS transistors being connected to a positive power supply;

first and second NMOS transistors, a source of the first NMOS transistor being connected to a drain of the second NMOS transistor, a drain of the first NMOS transistor being connected to the node, and a source of the second NMOS transistor being connected to either a negative power supply or ground; and an inverter having an output terminal connected to a gate of one of the first and second PMOS transistors and an input terminal connected to the node.

8. The method of claim 7, wherein the second portion of the address bits include inverted and uninverted address bits.

9. The method of claim 7, wherein the first portion of the address bits become active later than the second portion of the address bits.

10. The method of claim 9, wherein the first portion of address bits is manipulated by a clock signal.

11. The method of claim 7, wherein the plurality of subcircuits of the second stage of the two stage decoder are active when the switch is turned on.

12. The method of claim 7, further comprising the step of generating a plurality of word line signals from the plurality of subcircuits of the two stage decoder.

13. A method for decoding for a two stage decoder, comprising the steps of:

receiving a first portion of address bits by a first stage of the two stage decoder;

receiving a second portion of the address bits by a second stage decoder;

generating a control signal by the first stage of the two stage decoder for switchably controlling a switch through a single critical path; and controlling a plurality of subcircuits of the second stage of the two stage decoder through the switch to enable the second stage of the two stage decoder by discharging current from the portion of subcircuits of the second stage of the two stage decoder through a common discharge path through the switch, wherein each of the plurality of subcircuits of the second stage of the two stage decoder includes a pseudo AND gate, wherein the pseudo AND gate comprises first and second PMOS transistors arranged in parallel, drains of the first and second PMOS transistors being connected to a node and sources of the first and second PMOS transistors being connected to a positive power supply;

first and second NMOS transistors, a source of the first NMOS transistor being connected to a drain of the second NMOS transistor, a drain of the first NMOS transistor being connected to the node, and a source of the second NMOS transistor being connected to either a negative power supply or ground; and an inverter having an output terminal connected to a gate of one of the first and second PMOS transistors and an input terminal connected to the node.

14. The method of claim 13, wherein the second portion of the address bits include inverted and uninverted address bits.

15. The method of claim 14, wherein the first portion of the address bits becomes active later than the second portion of the address bits.

16. The two stage decoder circuit of claim 1, wherein the first portion of the address bits become active later than the second portion of the address bits.

17. The two stage decoder circuit of claim 2, wherein the first portion of the address bits become active later than the second portion of the address bits.

18. The method of claim 13, wherein the first portion of the address bits become active later than the second portion of the address bits.

19. The two stage decoder circuit of claim 1, wherein the second portion of address bits includes inverted and uninverted address bits.

20. The two stage decoder circuit of claim 2, wherein the second portion of address bits includes inverted and uninverted address bits.

* * * * *